United States Patent [19]
Ryan

[11] Patent Number: 5,886,948
[45] Date of Patent: Mar. 23, 1999

[54] MEMORY HAVING A PLURALITY OF EXTERNAL CLOCK SIGNAL INPUTS

[75] Inventor: Kevin J. Ryan, Eagle, Id.

[73] Assignee: Micron Technology, Inc., Boise, Id.

[21] Appl. No.: 960,581

[22] Filed: Oct. 29, 1997

Related U.S. Application Data

[62] Division of Ser. No. 772,195, Dec. 20, 1996.

[51] Int. Cl.$^6$ ..................................................... G11C 8/00
[52] U.S. Cl. ........................................... 365/233; 365/194
[58] Field of Search ..................................... 365/233, 194

[56] References Cited

U.S. PATENT DOCUMENTS

| | | | |
|---|---|---|---|
| 4,092,734 | 5/1978 | Collins et al. | 803/720 |
| 4,873,703 | 10/1989 | Corandall et al. | 375/118 |
| 5,243,703 | 9/1993 | Farmwald et al. | 395/325 |
| 5,337,285 | 8/1994 | Ware et al. | 365/227 |
| 5,355,391 | 10/1994 | Horowitz et al. | 375/36 |
| 5,430,676 | 7/1995 | Ware et al. | 365/189.02 |
| 5,432,823 | 7/1995 | Gasbarro et al. | 375/356 |
| 5,446,696 | 8/1995 | Ware et al. | 365/222 |
| 5,485,490 | 1/1996 | Leung et al. | 375/371 |
| 5,578,940 | 11/1996 | Dillon et al. | 326/30 |
| 5,663,661 | 9/1997 | Dillon et al. | 326/30 |

FOREIGN PATENT DOCUMENTS

| | | |
|---|---|---|
| WO94/29871 | 12/1994 | WIPO . |
| WO95/32549 | 11/1995 | WIPO . |
| WO96/37952 | 11/1996 | WIPO . |
| WO97/14289 | 4/1997 | WIPO . |
| WO97/42557 | 11/1997 | WIPO . |
| WO97/45793 | 12/1997 | WIPO . |

*Primary Examiner*—David Nelms
*Assistant Examiner*—M. Tran
*Attorney, Agent, or Firm*—W. Eric Webostad

[57] ABSTRACT

A method and apparatus for operating a synchronous memory from a plurality of external clock signals is described. By providing external system, read, and write clock signals, a memory is operated by delaying operational clock signals, such as read and write clock signals, with respect to a system clock signal in order to reduce the apparent access time of the synchronous memory and/or to increase setup time to the synchronous memory. The delay of the read and write clock signals with respect to the system clock signal may be accomplished through a phase-lock-loop or delay-lock-loop which is off-chip with respect to the integrated circuit synchronous memory. Delay circuitry may be employed for operating one or more than one synchronous memories.

6 Claims, 11 Drawing Sheets

MEMORY HAVING A PLURALITY OF EXTERNAL CLOCK SIGNAL INPUTS

This application is a divisional of application Ser. No. 08/772,195, filed Dec. 20, 1996.

TECHNICAL FIELD

The present invention relates to a memory having a plurality of external clock inputs for operation, and in particular relates to a synchronous dynamic random access memory having a combination of separate external system, read, and/or write clock signal inputs.

BACKGROUND

A recent trend in the dynamic random access memory ("DRAM") technology includes addition of operating from a single external system clock signal. Such DRAMs are called synchronous DRAMs or SDRAMs. This single external system clock signal is routed to several locations within the integrated circuit memory. This routing of the clock signal, along with associated circuitry in which it passes through, causes delay. Yet, it is necessary that several components of the integrated circuit memory SDRAM function in a synchronous manner, and such delay can effect this operation.

In particular, this delay adversely effects the apparent access time of an SDRAM. The apparent access time of an SDRAM is measured from the single external system clock signal input to valid data output. It is referred to the "apparent" access time, because it is the time "seen" by a system employing the SDRAM. For example, the access time for an output stage of an SDRAM during a read operation is typically measured from a positive edge of the single external system clock signal to the appearance of valid data at the outputs. Thus, the single external system clock signal is used to start an access (either a read or a write) and to clock data (either out or in).

In an effort to reduce apparent access time of the SDRAM, it has been proposed in the prior art that either a phase-lock-loop or delay-lock-loop (PLL or DLL) be added in-chip to the SDRAM. (By "in-chip" it should be understood to mean that the referenced circuitry is included in the SDRAM chip; "off-chip" means just the opposite of in-chip.) This PLL or DLL circuitry is to allow for internal generation of an "early" clock signal, namely, a signal which leads the single external system clock signal. This early clock signal may then be used to clock data to be read ("read data") out of the SDRAM. Because access time internal to an SDRAM is measured from an early clock signal in such a configuration, external or apparent access time measured from an external system or main clock signal will be reduced. The effectiveness and advantages of the proposed SDRAM are not necessarily known.

However, there are several problems which may be associated with adding either a PLL or DLL type of circuitry in-chip to an SDRAM. First, additional standby current for the SDRAM may be required. Second, additional time for powering up and -for locking the SDRAM may be needed. Third, adding a PLL or DLL type of circuitry in-chip may be costly and may add too much complexity to the SDRAM. For example, by adding such PLL or DLL devices more wafer area will be consumed, and difficult to implement shielding may be needed to avoid locking onto a wrong signal or noise, such as beat frequency. Lastly, including PLL or DLL circuitry on an SDRAM results in repeated circuitry for systems having more than one SDRAM.

Consequently, it would be desirable to provide an alternative to the addition of PLL or DLL circuitry in-chip to an SDRAM to control access timing.

SUMMARY OF THE INVENTION

The present invention provides a memory for receiving a plurality of external clock signals thereto. In particular, the memory receives an external read clock signal coupled to one or more data output temporary storage devices, such as one or more registers, latches, counters, memories, buffers, and the like. The external read clock signal is configured for synchronous operation of the data output from one or more temporary storage devices. The memory also receives an external system clock signal coupled to one or more address input temporary storage devices, such as registers, latches, counters, memories, buffers, and the like. The system clock signal is configured for synchronous operation of address, control, and data input to one or more temporary storage devices. An external write clock signal may be supplied to the memory instead of or in addition to the system clock signal. If an external write clock signal is supplied to a memory for synchronous operation of some combination of data, address, and/or control input to one or more temporary storage devices, such as registers, latches, counters, memories, buffers, and the like, then an external system clock need not be supplied to that memory. The external read clock is delayed with respect to either the external write or system clock such that the external read clock may be advanced. If both external system and write clock are present, the external write clock may be delayed with respect to the external system clock. This delay is to account for delays associated with in-chip and/or off-chip signal routing. Thus, an access to a memory may be initiated or started in reference to the external system or write clock signal, and the data may be clocked (in or out depending on the type of access) with another external clock signal, such as the external write clock signal or the external read clock signal.

By such configuration, the present invention provides a memory integrated circuit chip having a plurality of input pins, wherein input pins are configured for receiving an external system, read, and/or write clock signals. In the preferred embodiment, the memory integrated circuit is a synchronous dynamic random access memory ("SDRAM"). Thus, less standby current may be needed; clock delay/skew circuitry may be powered up concurrently with SDRAM(s); and producing an SDRAM may be less costly and less complex.

The present invention also provides a memory module. In accordance with the present invention, the memory module comprises at least one memory and may include a clock distribution circuit. The clock distribution circuit is configured to provide a plurality of external clock signals to one or more memories, the external clock signals may include a system clock signal, a read clock signal and a write clock signal. The clock distribution circuitry may include a phase-lock-loop (PLL) and/or delay-lock-loop (DLL), or similar circuitry suitable for generating a delayed clock signal with respect to a received system clock signal. The lock loop circuitry may be employed for servicing one or more memories. Notably, clock distribution circuitry, PLL, and/or DLL may be located off-chip and/or off-module; in such cases, it is possible to locate them on a separate circuit board of a system. Consequently, in a module or system having more than one memory, considerable savings and flexibility may be achieved over providing a PLL or DLL in-chip. For example, redundancy of having more than one PLL or DLL is avoided. Moreover, flexibility is facilitated by a system clock signal routed directly to the SDRAM or through a PLL or DLL.

A memory or memory module in accordance with the present invention may be employed in various types of information handling systems, including but not limited to network cards, telephones, scanners, facsimile machines, routers, copy machines, displays, printers, calculators, and computers, among other systems. By using such systems, a single set of PLL or DLL circuitry may be employed to operated plurality of synchronous memories. Consequently, skew associated with different memory locations may be adjusted accordingly.

Other features and embodiments of the present invention are described or are apparent from reading the detailed description or by practicing the present invention.

DETAILED DESCRIPTION OF THE DRAWINGS

The features of the present invention, as well as object and advantages, will be best understood by reference to the appended claims, detailed description of particular embodiments and accompanying drawings where;

Reference numbers refer to the same or equivalent part of the present invention throughout the several figures of the drawings.

DETAILED DESCRIPTION OF THE PREFERRED EMBODIMENTS

Figure 1:
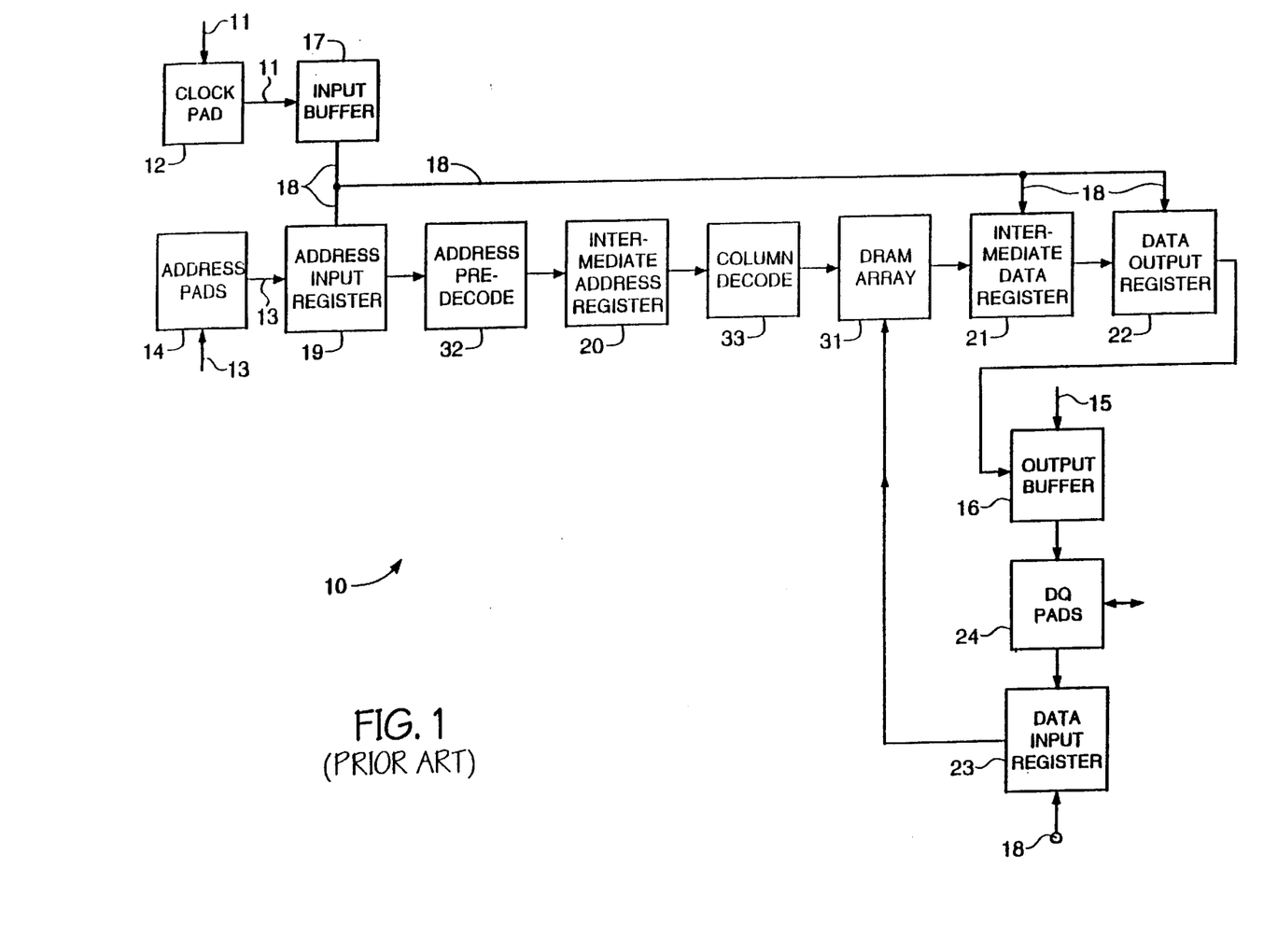
FIG. 1 is a block diagram of an exemplary portion of a synchronous memory known in the art of the present invention.

Referring to FIG. 1, there is shown a block diagram of an exemplary portion of a conventional synchronous dynamic random access memory (SDRAM) 10, as known prior to the present invention. It should be noted that SDRAM 10 includes address predecode 32, column decode 33, and DRAM array 31. SDRAM 10 receives and external system clock signal 11 and external address signal 13. Signal 15 is typically an internally generated enable/disable signal to output buffer 16. The external address signal 13 is supplied to address pads 14 and travels to address input register 19. External system clock signal 11 is received to clock pad 12 and travels to input buffer 17. At input buffer 17, external system clock signal 11 is delayed and input buffer 17 may then supply a delayed external clock signal 18 to a variety of locations throughout SDRAM 10. This routing further delays signal 18.

Delayed system clock signal 18 is supplied to address input register 19, intermediate address register 20, intermediate data register 21, data output register 22, and data input register 23. In other words, internal system clock signal 18 is supplied to all relevant circuitry which is operated off of an external system clock signal 11. Because each routing path might not be identical, a skew may develop between the various locations receiving internal clock signal 18. In other words, address input register 19, intermediate address register 20, intermediate data register 21, data output register 22, and data input register 23 may not receive internal clock signal 18 at the same point in time causing a delay in the operation of SDRAM 10. For example, the apparent delay of SDRAM 10 for a read operation may be measured from the time a leading edge of a pulse of an external system clock signal 11 was received to clock pad 12 and an output resulted therefrom at output ("DQ") pads 24. Thus, access time is delayed not only by data output register 22, output buffer 16, and DQ pads 24, but also the propagation and delay cause by clock pad 12, input buffer 17, and the routing of internal clock signal 18.

Figure 2:
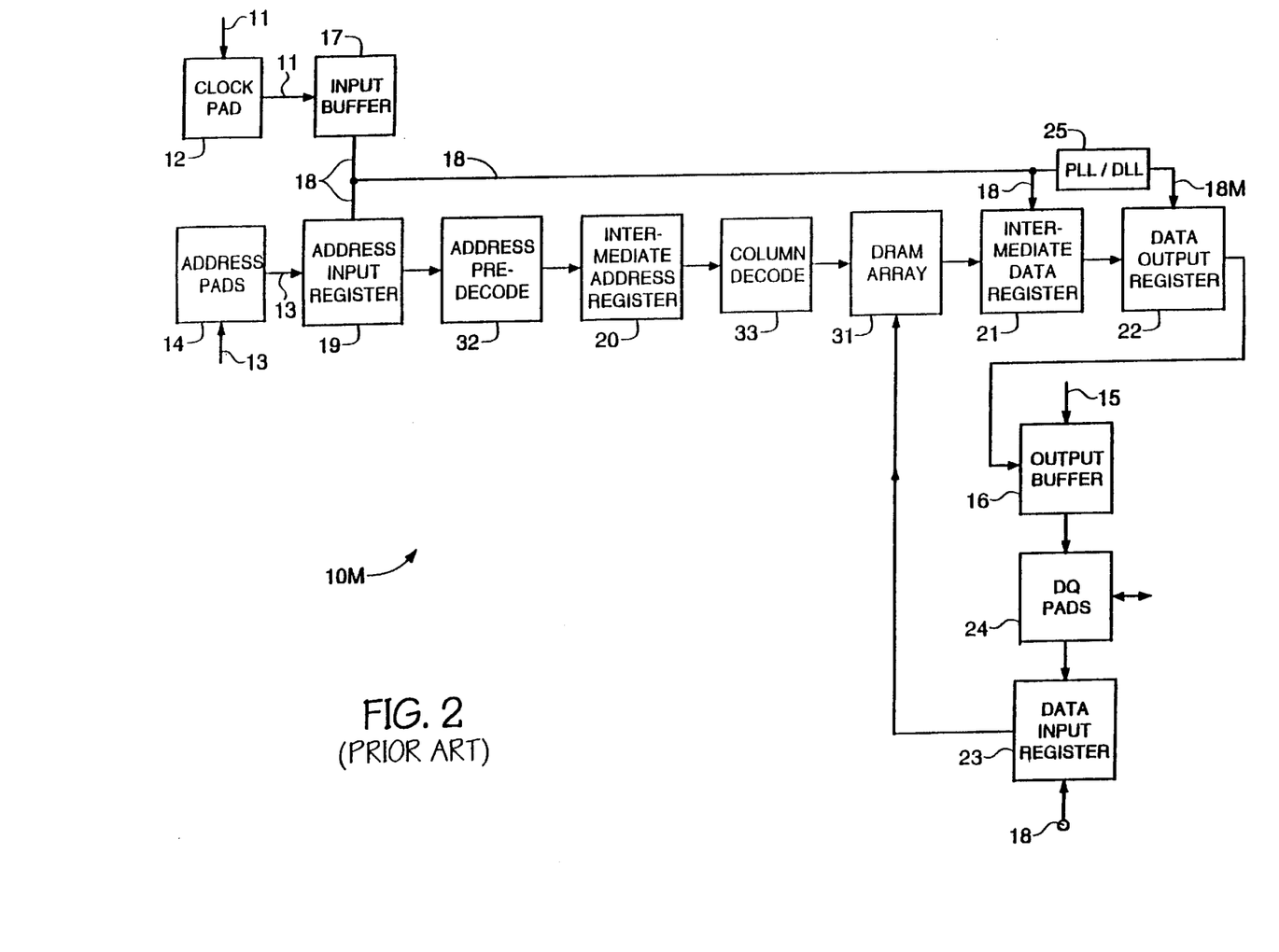
FIG. 2 is a block diagram of an exemplary portion of a memory having a PLL or DLL as proposed in the art of the present invention.

In order to compensate for this skew or delay of external system clock signal 11 with respect to operation of internal components to SDRAM 10, a modified SDRAM 10M was proposed in the prior art. FIG. 2 is a block diagram of an exemplary SDRAM 10M, as proposed in the field of and prior to the present invention. Notably, SDRAM 10M is similar to that of SDRAM 10 shown in FIG. 1 with the exception of an addition of a phase-lock-loop (PLL) or delay-lock-loop (DLL) circuitry 25. PLL or DLL circuitry 25 is coupled for receiving internal clock signal 18 and providing internal clock signal 18M. PLL or DLL 25 is employed to delay clock signal 18 to data output register 22. The amount of delay has been proposed to be one clock period minus the delay owing to input buffer 17 and the signal path of external system clock signal 11 and internal clock signal 18. Owing to such delay, clock signal 18M appearing at data output register 22 will be delayed exactly one period from external system clock signal 11. In other words, internal clock signal 18M is in synchronization with external system clock signal 11 except that it is delayed one clock period with respect to external system clock signal 11. By such delay, data output register 22 may be operated synchronously with external system clock signal 11. However, by adding a PLL or DLL to SDRAM OM, a fixed off-set of delay must be employed. This reduces the flexibility of operation of SDRAM 10M while adding additional cost and complexity.

Figure 3:
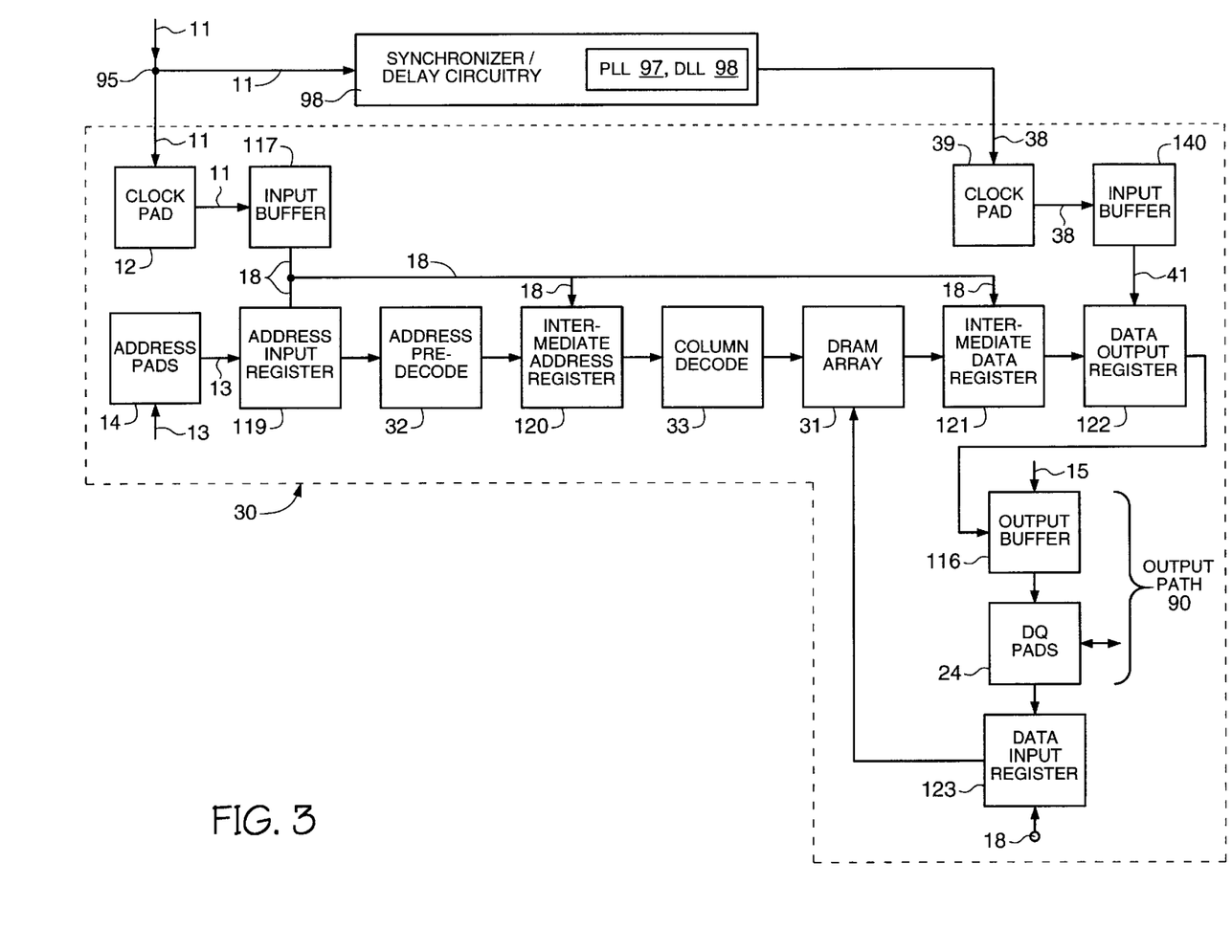
FIG. 3 is a block diagram of an exemplary portion of a synchronous memory configured for receiving an external system clock and an external read clock in accordance with the present invention.

Now referring to FIG. 3, there is shown a block diagram of an exemplary portion of a synchronous memory 30 and synchronizer/delay circuitry 98 in accordance with the present invention. Notably, memory 30 includes temporary storage devices 116, 117, 119–123, 140, which may include buffers and registers as illustratively shown in FIG. 3, as well as like elements listed elsewhere herein. In particular, it should be understood that while the preferred embodiment of the present invention employs a DRAM array 31 as memory 30 is preferably a SDRAM, other types of memory arrays may be used in accordance with the present invention.

In contrast to SDRAMs 10 and 10M of FIG.'s 1 and 2, memory 30 employs an external read clock signal 38. At node 95, external system clock 11 is provided both to memory 30 and external synchronizer/delay 98. External read clock signal 38 is synchronized with and delayed with respect to external system clock signal 11 by means of external synchronizer/delay circuitry 98. Circuitry 98 is off-chip with respect to memory 30. As explained elsewhere herein, separate external clock signal inputs to memory 30 allow for a reduction in memory circuitry. Moreover, for a plurality of memories on a module or on a system circuit board, such as a mother board or daughter card, one external synchronizer/delay circuitry 98 can provide clock signals to multiple memories for reduced circuitry requirements. Also, it may be easier to shield circuitry 98 from noise, as compared to shielding multiple memories 30. It may be desirable to shield circuitry 98 if it includes PLL 97 or DLL 96, otherwise PLL 97 or DLL 96 may undesirably synchronize to noise beat frequency.

External read clock signal 38 is received to read clock pad 39 and supplied to input buffer 140. Input buffer 140 delays external read clock signal 38 to provide internal read clock signal 41 to data output register 122. It should be understood that the delay of input buffer 117 and input buffer 140 may be matched, such that the delays with respect to the clock signals each receive is the same for synchronous operation. Alternatively, input buffer 140 may have a longer delay than that of buffer 117 in order to delay internal clock signal 41 with respect to external system clock signal 11. In any event, external read clock signal 38 is delayed with respect to external system clock signal 11. By delaying internal clock signal 41 appearing at data output register 122, for example by exactly one period of external system clock signal 11, apparent access time is reduced as explained elsewhere herein.

A maximum phase difference (or offset value) between clocks appearing at intermediate data register 121 and data output register 122 may be set to equal one clock period minus time necessary for data to be clocked out of intermediate register 121, and minus setup time for output register 122. By applying external read clock signal 38, additional flexibility is allowed for adjusting offset or delay, including adjusting below such a maximum value. For example, this could be advantageous in a system where output hold time measured from external system clock signal 11 is important. Because output hold time is reduced along with access time, and because some systems may not be able to tolerate a reduction in output hold time, a less-than-maximum offset would be desirable.

Figure 4:
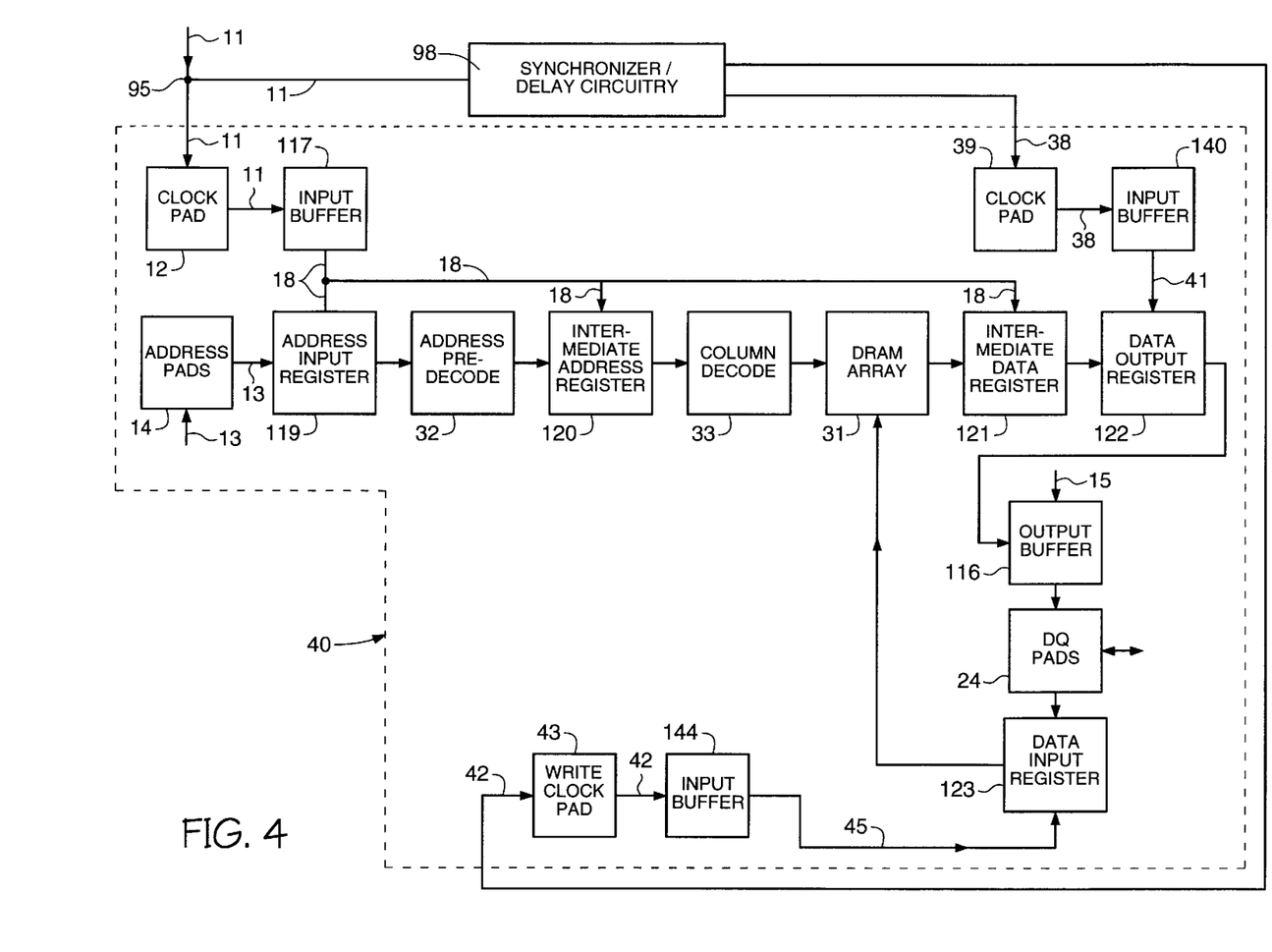
FIG. 4 is a block diagram of an exemplary portion of a synchronous memory having external system, read, and write clock signals supplied thereto in accordance with the present invention.

Referring to FIG. 4, there is shown a block diagram of an exemplary synchronous memory 40 in accordance with the present invention. Memory 40 is an alternative embodiment of memory 30 shown in FIG. 3. With continuing reference to FIG. 4 and renewed reference to FIG. 3, memory 40 adds write clock pad 43 and input buffer 144 for receiving and delaying external write clock signal 42 to provide a delayed write clock signal, namely, internal write clock signal 45. Signal 42 is synchronized with and delayed with respect to signal 11 by circuitry 98. External write clock signal 42 is delayed to allow for increased availability of data setup time for write data. In other words, internal clock signal 45 is used to operate input data register 123, while input data provided to memory 40 is clocked off of external system clock signal 11. With write clock signal 42 delayed versus external system clock signal 11, thus delaying arrival of input data, more time is allocable for data to reach register 123 before clocking such data with internal write clock signal 45.

Figure 5:
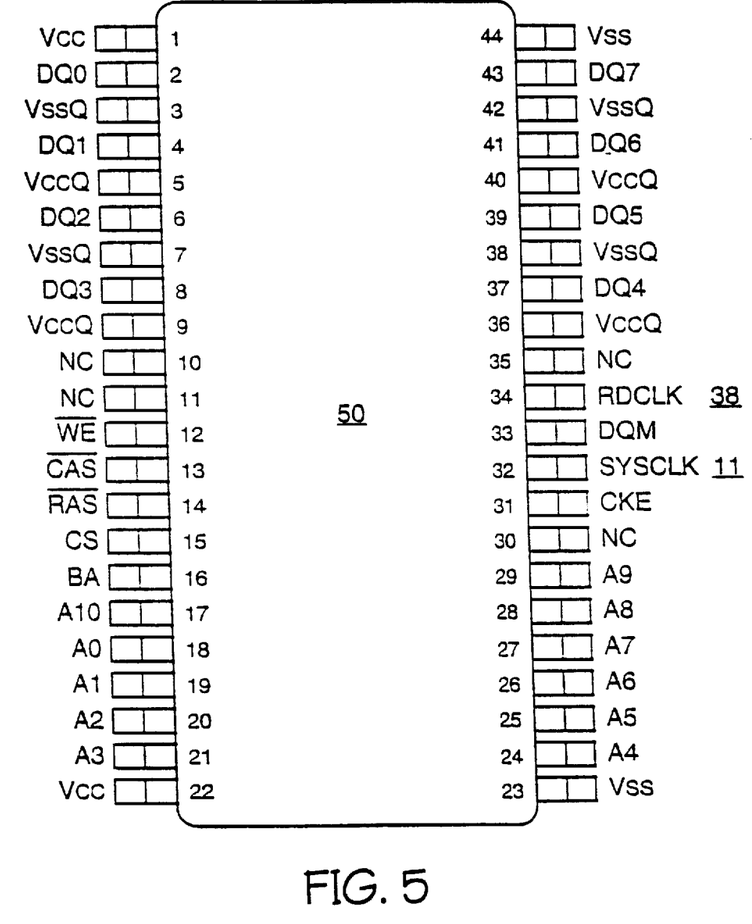
FIG. 5 is a top plan view of a synchronous memory integrated circuit having an exemplary pin-out for receiving external system and read clock signals in accordance with the present invention.
Figure 6:
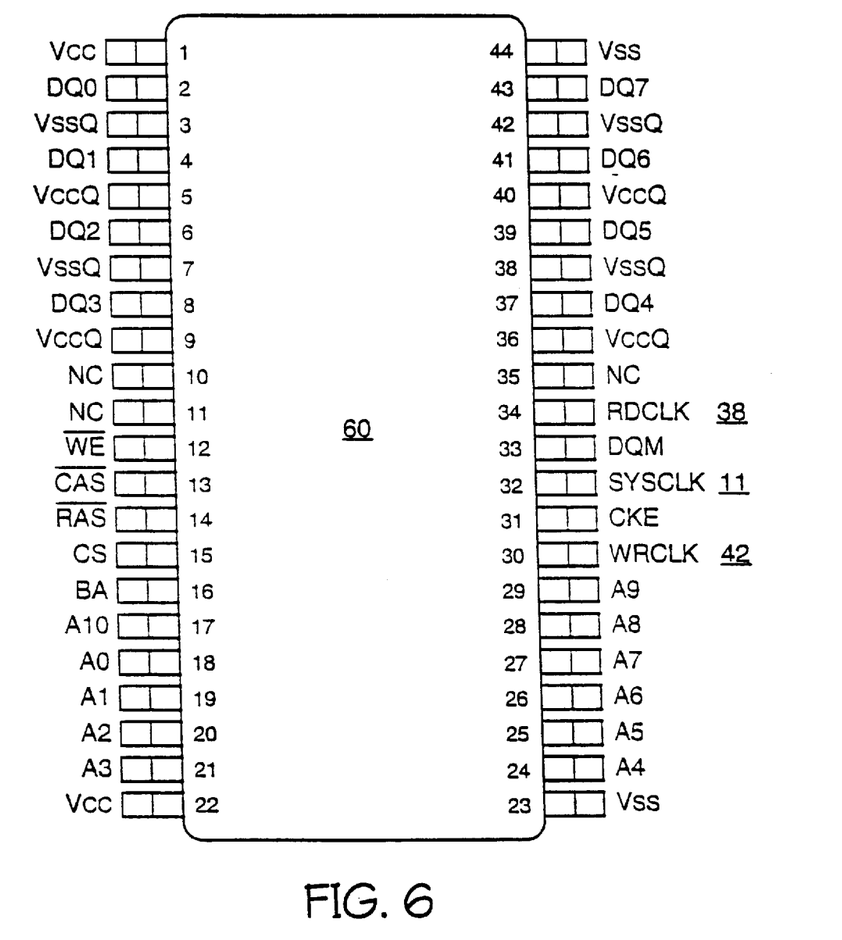
FIG. 6. is a top plan view of a synchronous memory integrated circuit having an exemplary pin-out for receiving external system, read, and write clock signals in accordance with the present invention.

Referring to FIGS. 5 and 6, there are shown top plan views of memory integrated circuit chips 50 and 60 in accordance with the present invention. As shown, chip 50 receives external system clock signal 11 and external read clock signal 38, and chip 60 receives external system clock 11, external read clock 38, and external write clock 42. Chips 50 and 60 may represent pinouts for memories 30 and 40, respectively. Chips 50 and 60 may also be employed in a memory module as shown in FIG. 7.

Figure 7:
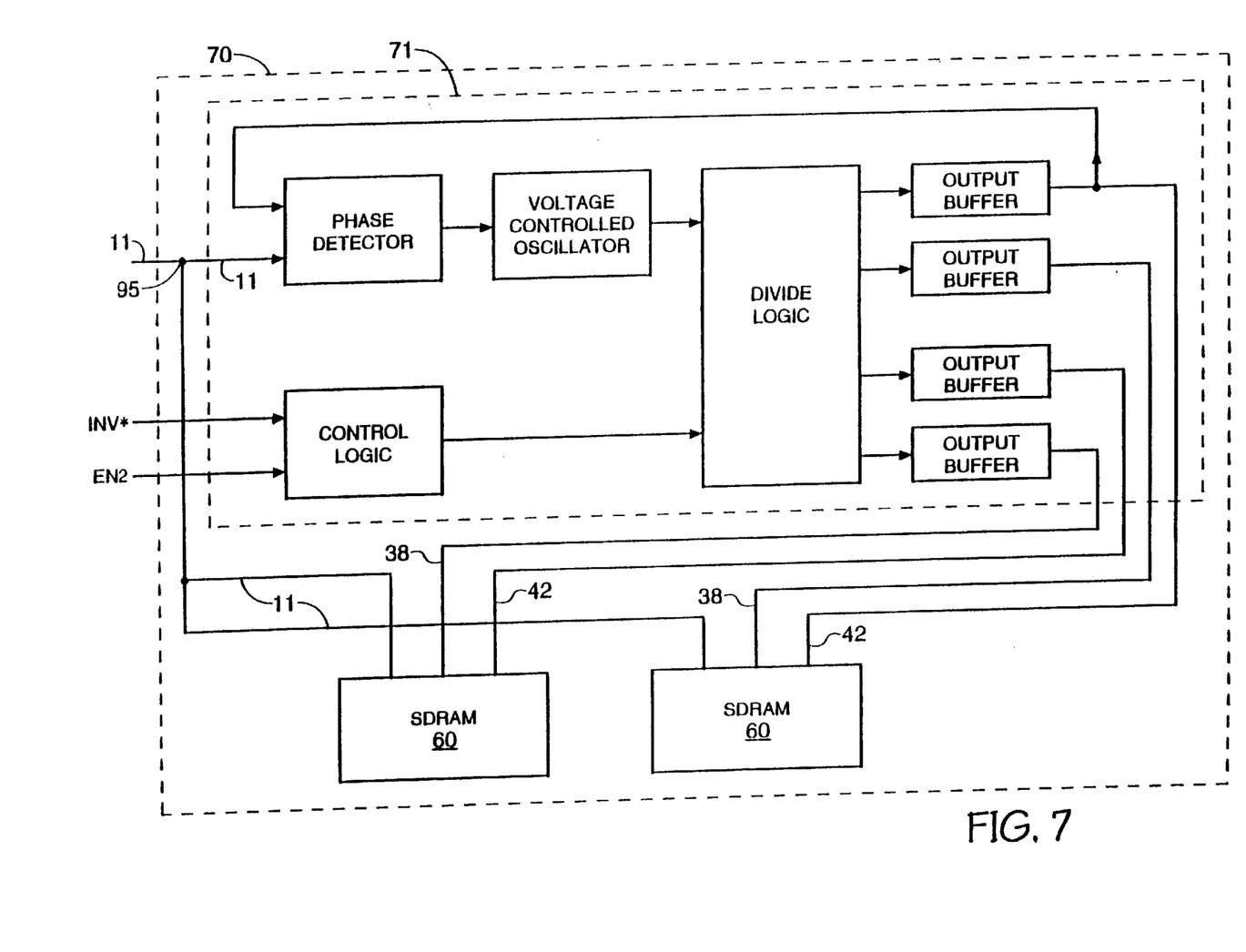
FIG. 7 is a block diagram of an exemplary memory module having a phase-lock-loop circuit for providing external clock signals to SDRAMs in accordance with the present invention.

In FIG. 7, there is shown a block diagram of an exemplary memory module 70 in accordance with the present invention. External system clock signal 11 is provided to low skew output buffer 71. Output buffer 71 is known in the art and is available from Integrated Circuit Systems, Inc. under Part No. AV9172. Alternatively, equivalent circuitry may be employed for providing skewed clock signals for clock distribution. Also, alternatively, such arrangements may be part of a system (board) layout, so memory module 70 and buffer 71 are shown with dashed-lines.

As operation of buffer 71 is known in the art of the present invention, further explanation will be avoided here in order to clearly describe the present invention. As indicated, internal system clock signal 11, external read clock 38, and external write clock 42 are supplied to SDRAMs 60. It should be understood that while only two SDRAMs 60 are shown, one, two, or more SDRAMs may be employed. In fact, parts AV9172 typically provides for six output clock signals. Moreover, while SDRAM 60 is shown, it should be understood that only two clock inputs may be provided for pinouts having only two external clock signals, such as chip 50 shown in FIG. 5. Moreover, while chip 50 shown in FIG. 5 is shown with a separate read clock signal 38, chip 50 may be configured for write clock signal 42 in place of read clock signal 38.

Figure 8:
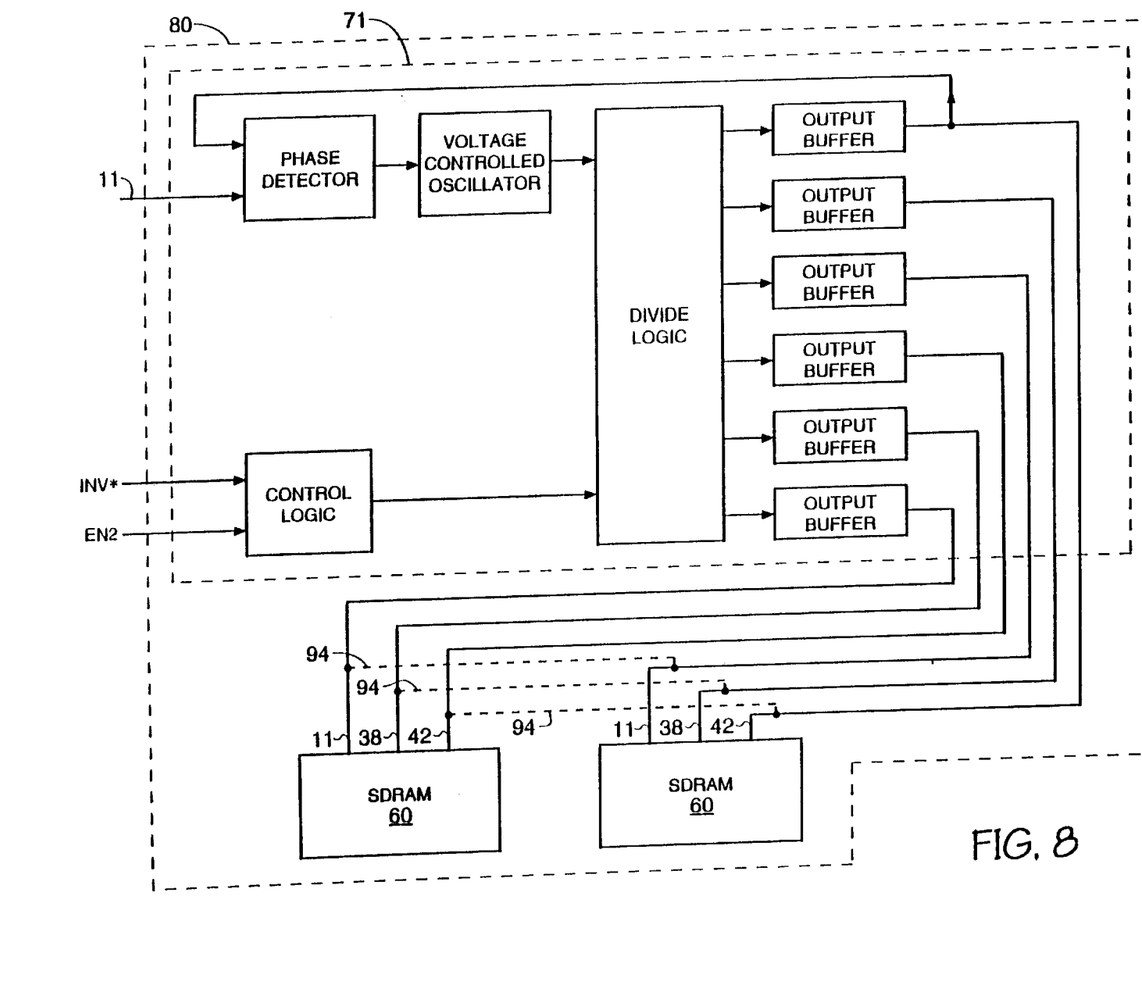
FIG. 8 is a block diagram of alternate embodiment of the memory module of FIG. 7.

Referring to FIG. 8, there is shown a block diagram of an exemplary memory module 80 in accordance with the present invention. Memory module 80 is similar to that of memory module 70 of FIG. 7 except that system clock signal 11 is provided to SDRAM 60 as an output from low skew output buffer 71. Also, it should be understood that separate lines need not be provided to each memory of module 80. Rather, signals 11, 38, 42 may be provided from a common output of buffer 71 to more than one memory, as indicated by dashed lines 94. Notably, there is some delay associated with routing of signals 11, 38, 42 to one or memories. For example, using a common output from buffer 71, such delay may be taken into account by providing equal line lengths; otherwise, if not using a common output of buffer 71, such delay may be accounted for by buffer 71.

Figure 9:
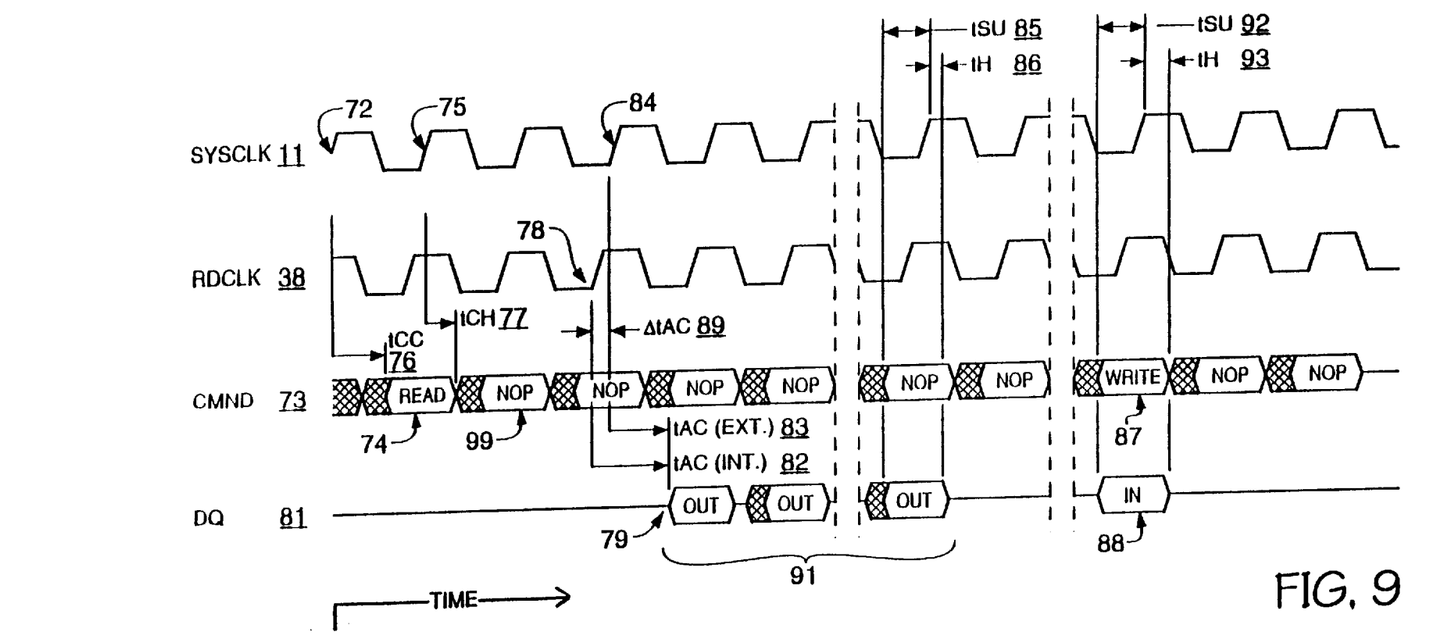
FIG. 9 is a timing diagram of a synchronous memory read clock cycle in accordance with the present invention.

Referring to FIG. 9, there is shown a timing diagram employing external read clock signal 38 (RDCLK 38) for a read operation in accordance with the present invention. In particular, FIG. 9 shows a burst read operation and a single write operation for purposes of illustration. Both read and write operations are illustratively shown as occurring within a page access to SDRAM 50 (shown in FIG. 5); burst orders of factors of two such as 2, 4, 8, 16, 32, 64, . . . are typically preferred.

With continuing reference to FIG. 9, and renewed reference to FIG.'s 3 and 5, external system clock signal (SYSCLK) 11 leads RDCLK 38. SYSCLK 11 is used to clock command information, address information, and write data (data to be written to a memory) into SDRAM 50, 60 (shown in FIG.'s 5, 6). RDCLK 38 is used to clock read data out of SDRAM 50, 60 (shown in FIG.'s 5, 6). At time, t, equal to zero nanoseconds (ns), SYSCLK 11 provides a positive edge 72. Positive edge 72 is used to clock READ command 74 (on a group of command (control) signals, CMND, 73) out of a memory controller (not shown) and to inputs of SDRAM 50. READ command 74 is clocked into a command register (not shown) in SDRAM 50 on a subsequent positive clock edge, for example edge 75. Time tCC (clock to command delay) 76 represents a time delay from edge 72 to when command signals are valid inputs of SDRAM 50. Time tCH (command hold time) 77 represents an amount of time after a subsequent positive clock edge for which a command driven by a previous clock edge remains valid. NOP (no operation) 99 follows READ CMND 74.

A first data element, for example read data 79 for burst read access, propagates to data output register 22 and onto DQ pin(s), for example DQ signal 81, of SDRAM 50 via a positive edge (edge 78 in this example) of RDCLK 38. Propagation time is dependent on internal architecture and process technology of SDRAM 50. RDCLK 38 edge 78 leads SYSCLK 11 edge 84 by an amount delta tAC 89. Delta tAC 89 is equal to cycle time of either RDCLK 38 or SYSCLK 11, as their cycle times are equal, minus offset or delay from SYSCLK 11 to RDCLK 38. Internal or actual access time, tAC int., 82 is an amount of time after edge 78 for data to propagate through output register 22 and output path 90 to DQ pins (for example DQO to DQ7). External or apparent access time, tAC ext.,-83 equals tAC int. 82 minus delta tAC 89.

Output (read) data 91 from SDRAM 50 is shown being setup (setup time, tSU, 85) and held (hold time, tH, 86) with respect to SYSCLK 11 for clocking onto a receiving device (not shown) external to SDRAM 50. Alternatively, another clock signal which is delayed relative to SYSCLK 11 may be used for receiving data. This has a benefit like using a write clock for inputting data to an SDRAM, as explained in more detail elsewhere herein.

Figure 10:
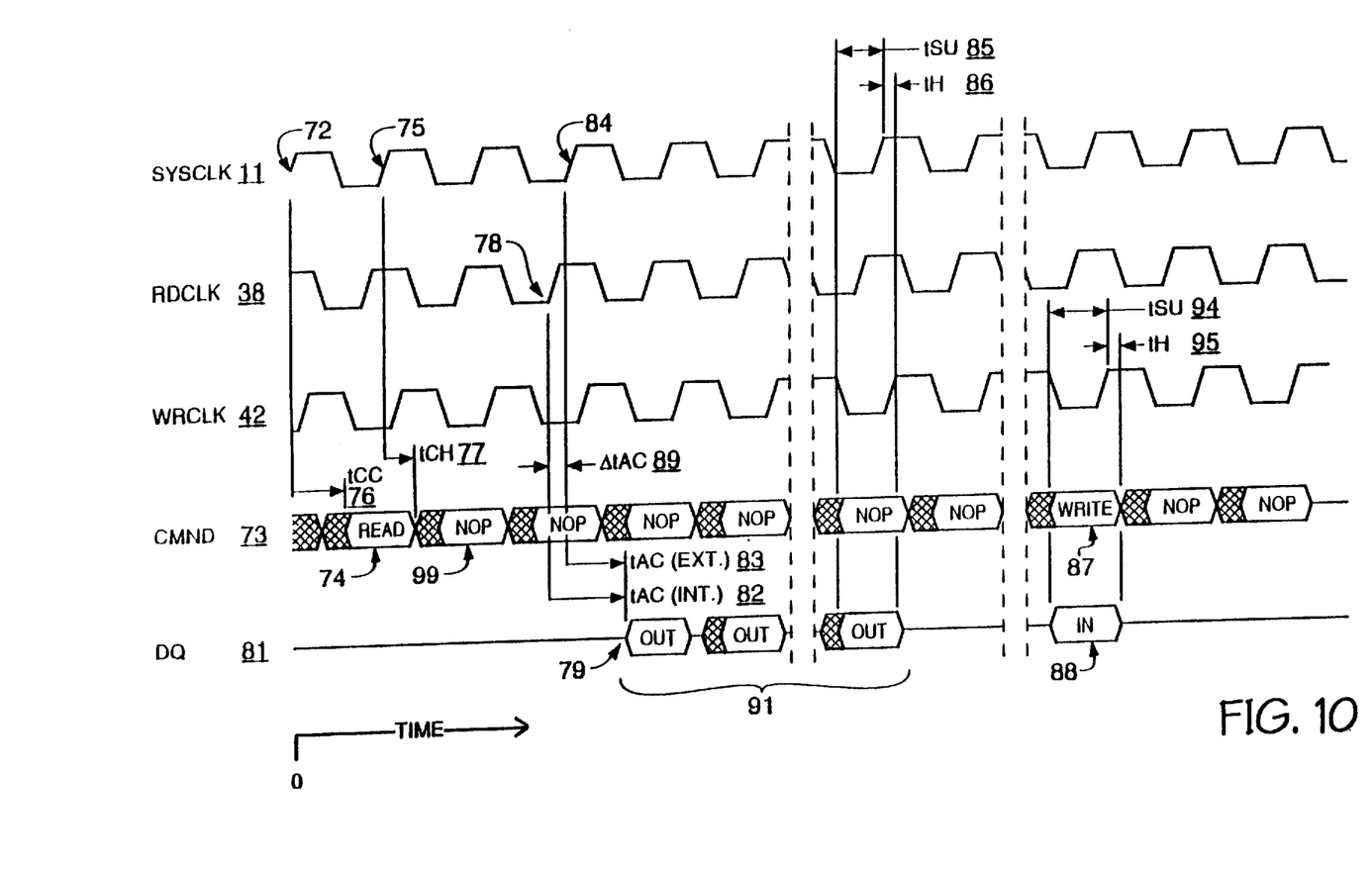
FIG. 10 is a timing diagram similar to that of FIG. 9, but with an addition of write clock signal in accordance with the present invention.

Also, shown for purposes of illustration is write operation 87. As SYSCLK 11 is used to clock input data (write data) 88 into input data register 23 of SDRAM 50, input data 88 is shown as being setup, tSU, 92 and held, tH, 93 with respect to SYSCLK 11. However, in FIG. 10, there is shown a timing diagram similar to that of FIG. 9, but with an addition of write clock signal (WRCLK) 42 in accordance with the present invention. WRCLK 42 is shown as delayed with respect to SYSCLK 11. While SYSCLK 11 is shown with WRCLK 42, it should be understood that SYSCLK 11 may be omitted for WRCLK 42. In which case, address, command, and data-in information may be clocked off of WRCLK 42. Thus, command, address, and data-in information may be setup (tSU 94) and held (tH 95) with respect to either SYSCLK 11 or WRCLK 42, allowing more time for such information to be setup before being clocked into a temporary storage device. Some hold time may be lost owing to an increase in setup time.

Notably, a timing diagram for address signal 13 (shown in FIGS. 3 and 4) is not illustratively shown herein; however, such timing will be apparent to those of ordinary skill in the art of the present invention in light of this specification. Moreover, while clocking is shown using the leading edge of a signal, it will be apparent to those of ordinary skill in the art of the present invention in light of this specification that clocking may be off of the leading, trailing, or both edges of any of the clock signals employed in accordance with the present invention.

Figure 11:
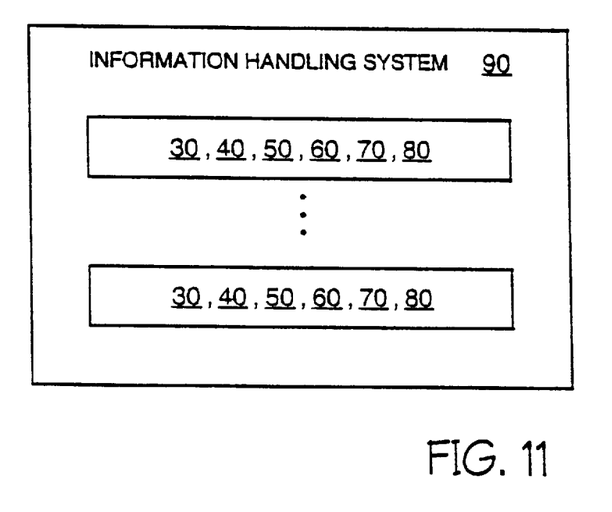
FIG. 11 is a block diagram of system having one or more memories or memory modules employed therein in accordance with the present invention.

Referring to FIG. 11, there is shown a block diagram of system 100 having one or more memories 30, 40, 50, 60 or memory modules 70, 80 employed therein in accordance with the present invention. In other words, the present invention may be employed in various types of information handling systems 90, including but not limited to network cards, telephones, televisions, video cassette recorders, scanners, facsimile machines, routers, copy machines, displays, printers, calculators, and computers, among other systems. Moreover, while the present invention has been described in terms of SDRAM, it will be apparent to those of ordinary skill in the art of the present invention in light of this specification that packet or protocol oriented synchronous types of memory may also be used in accordance with the present invention.

The present invention has been particularly shown and described with respect to certain preferred embodiments and features thereof It should be readily apparent to those of ordinary skill in the art that various changes and modification in form and detail may be made without departing from the sphere and scope of the present invention as set forth in the appended claims.

What is claimed is:

1. A system having memory circuitry, the memory circuitry comprising:

at least one memory configured for receiving a first external clock signal selected from the group consisting of an external system clock signal and an external write clock signal, and configured for receiving a second external clock signal; and a clock delay and distribution circuit coupled externally to the memory and configured for receiving the first external clock signal and providing the second external clock signal therefrom, the second external clock signal variably skewed with respect to the first external clock signal.

2. A method for operating a memory, comprising:

delaying one or more external clock signals with respect to a system clock signal:

after the step of delaying, providing the external clock signals to the memory, the external clock signals selected from the group consisting of an external read clock signal and an external write clock signal; and generating at least one of the external clock signals from the system clock signal.

3. A method for operating a memory, comprising:

delaying one or more external clock signals with respect to a system clock signal;

after the step of delaying, providing the external clock signals to the memory; and generating at least one of the external clock signals from the system clock signal.

4. A memory comprising:

a first external clock signal input coupled to circuitry of the memory and configured to receive a first external clock signal; and a second external clock signal input coupled to the circuitry of the memory and configured to receive a second external clock signal synchronized and delayed with respect to the first external clock signal;

the circuitry configured to process address and control information from timing associated with the first external clock signal and to process data from timing associated with the second external clock signal.

5. A memory, as in claim 4, wherein the circuitry is further configured to process data from timing associated with the first external clock signal.

6. A memory, as in claim 5, wherein the first external clock signal is selected from the group consisting of a system clock signal and a write clock signal, and the second external clock signal is a read clock signal.

* * * * *